United States Patent
Cheah et al.

(10) Patent No.: US 6,923,891 B2
(45) Date of Patent: Aug. 2, 2005

(54) COPPER INTERCONNECTS

(75) Inventors: Li Kang Cheah, Singapore (SG); Xu Shi, Singapore (SG); Lang Hu, Singapore (SG)

(73) Assignee: Nanofilm Technologies International Pte Ltd., Singapore (SG)

( * ) Notice: Subject to any disclaimer, the term of this patent is extended or adjusted under 35 U.S.C. 154(b) by 105 days.

(21) Appl. No.: 10/340,898

(22) Filed: Jan. 10, 2003

(65) Prior Publication Data

US 2004/0137725 A1 Jul. 15, 2004

(51) Int. Cl.[7] .................................................. C23C 14/34
(52) U.S. Cl. ........................... 204/192.11; 204/192.32; 204/192.38; 204/298.04; 204/298.41; 204/298.16; 204/298.06; 204/298.08
(58) Field of Search ...................... 204/192.11, 192.32, 204/192.38, 298.04, 298.41, 298.16, 298.06, 298.08

(56) References Cited

U.S. PATENT DOCUMENTS 5,851,475 A * 12/1998 Komvopoulos et al. .... 264/430
6,274,492 B1 * 8/2001 Klimes et al. .............. 438/675

FOREIGN PATENT DOCUMENTS

WO    WO 96/26531    * 8/1996    ............ H01J/37/32

* cited by examiner

Primary Examiner—Steven VerSteeg
(74) Attorney, Agent, or Firm—Sughrue Mion, PLLC

(57) ABSTRACT

A method for forming a conductive region on a first portion of a substrate, the method being constituted by exposing the first portion to a filtered beam of substantially fully ionised metallic ions under a pulsed, modulated electrical bias. The method uses FCVA (Filtered Cathodic Vacuum Arc) techniques to generate the filtered ion beam and permits the formation of a conformal metal coating, even in high aspect ratio visa and trenches. The method also permits the in-filling of vias and trenches to form conductive interconnects. Particular examples concern the deposition of copper ions. An adapted FCVA apparatus deposits metals on substrates. A control apparatus controls ion beams impacting upon substrates, the control apparatus being suitable for incorporation within existing filtered ion beam sources.

32 Claims, 13 Drawing Sheets

COPPER INTERCONNECTS

FIELD OF THE INVENTION

The present invention relates to the deposition of a thin layer of material onto a substrate using a vapour deposition technique, and preferably using FCVA (Filtered Cathodic Vacuum Arc) techniques.

BACKGROUND TO THE INVENTION

In microelectronics, and in particular in the semiconductor industry, the use of aluminium as an interconnect material has been declining. Copper has become the preferred interconnect material. The use of aluminium is being phased out for two main reasons: aluminium's relatively high resistivity ($2.65 \times 10^{-6}$ ohm.cm) and electromigration.

The use of copper in place of aluminium overcomes both the resistivity and electromigration problems to some extent. Resistivity in copper is lower than that of aluminium ($1.67 \times 10^{-6}$ ohm.cm) and the higher mass and higher melting point of copper (1085° C. compared to 660° C. for Al) results in the lower susceptibility to electromigration. As a result higher current densities can be allowed at a given packing density provided copper interconnects replace aluminium ones.

During the 1980's, a typical feature size in an integrated circuit was of the order of a micron (~1 $\mu$m). Devices then were provided with either a single layer or a double layer of aluminium alloy metallisation. The relatively large feature size meant that contacts could be formed from the aluminium, which had low resistance, and that any conductive connector formed between conductive layers was sufficiently wide to allow coverage using sputtered aluminium (such conductive connectors are commonly referred to as 'vias').

More recently, the trend has been towards smaller feature sizes (0.13 microns as of 2001) and to multilevel metallisation. Copper metallisation has replaced aluminium as the metallisation of choice. A viable alternative to copper is silver.

The increased number of layers (as many as eight layers in logic chips) places additional pressure upon the reliability of vias that are themselves decreasing in width. There is a trend toward holes (either trenches or vias) of increasing aspect ratio, where aspect ratio may be defined as the ratio of the depth of a hole to the narrowest width of that hole. Often the most pronounced reliability requirements are in the lower metal layers where the pitch and aspect ratio conditions are most demanding.

Copper is not a perfect material however, it does have an inconveniently high diffusion rate which makes direct deposition of a copper layer on a dielectric substrate impractical. Diffusion of copper into a substrate, for example silicon or $SiO_2$, can create deep-level defects, electrical leakage between metal lines and at the very least reduces the resistivity of the substrate. Typically, a diffusion barrier layer is deposited over regions where copper is to be deposited, thereby preventing copper particles from degrading the properties of the substrate. Materials used in the barrier layer are generally refractory metals or their nitrides: for example Ta(N), Ti(N), W(N), or a multilayer of a combination of these materials.

Rather than etch a selected portion of a complete metal layer (subtractive metal etch patterning), the preferred method for patterning is the so-called damascene patterning process. Via and/or metal line patterns are etched into a dielectric layer. These etched holes are then inlaid with copper. When both types of hole are filled during the same deposition step, the patterning process is termed a dual damascene process.

The deposition of copper on integrated circuit substrates conventionally comprises of a number of steps, as illustrated in FIG. 1A. A diffusion barrier is first laid down upon the substrate 102. A thin seed layer of copper is then formed over the barrier generally using a dry process (for example chemical vapour deposition (CVD) or sputtering) 104. To cover the seed layer conformally, an electroless copper plating technique is often employed 108, and before electroless copper plating (from an ionic solution often including copper sulphate) can take place the substrate for deposition must generally be activated 106 by a catalytic surface (gold, platinum or palladium). During the activation process 106, the substrate is exposed to a solution of precursors of the catalyst, including often highly toxic reagents such as HF, HCl, and acetic acid, and the catalytic activation layer precipitates onto the substrate. Once activated, the substrate can be plated using the electroless technique 108. The enhanced conductive seed layer can then be used in a per process, electro copper plating (ECP) 110. To remove excess copper deposits a process known as chemical mechanical polishing (CMP) is employed 112. Typically, this involves the use of a polishing pad combined with a slurry compound. CMP therefore entails considerable mechanical stresses upon the substrate and metal.

Thin films of material are increasingly used in a large number of technologies ranging from electronics to optics to metallurgical coatings. Ideally, the functional properties of a thin film should be equivalent or superior to those of the bulk material. These properties are largely determined by the parameters employed in the deposition process. However, whatever the final application, there are properties that are desirable in all types of thin films. These properties include good adhesion to the substrate, reproducibility and sufficient mechanical strength and hardness. Further constraints are imposed depending upon the final application, for example, good optical properties for optical films, high microhardness for wear-resistant layers and dense porous-free films for corrosion-resistant coatings.

The formation of a conformal thin seed layer of copper is particularly acute when applied to the filling in of trenches or vias in the substrate (see FIG. 1B). As the reader will appreciate, conformal is a term of art. A conformal coating uniformly coats the substrate surface irrespective of the contours of the surface (i.e. vertical, horizontal or sloping).

The semiconductor industry currently uses a variety of vacuum coating process falling broadly into two types: physical vapour deposition (PVD) and (plasma enhanced) chemical vapour deposition ((PE)CVD). Both types of deposition technique are characterised by the comparatively high temperature required and by the often toxic, raw materials and by-products generated.

The PVD process mainly consists of evaporation and sputtering. Vacuum evaporation is a relatively simple process involving a system with a vacuum chamber, vacuum pumping system, a power supply and heating element, and a fixture to position the part over the source. Heat could also be generated by the more expensive electron beam method.

Sputtering is a well-known and versatile thin film deposition process. Material is sputtered from a source (target) onto a substrate. The process can produce many kinds of materials in a partial vacuum environment. Compared to evaporation, sputtering produces denser films with better adhesion to the substrate. It can also be scaled up easily.

Conventional magnetron sputtering has a low efficiency of ionization from energetic collision between the electrons and gas atoms leaving a high proportion of neutral particles. Most of the coating species reaching the wafer surface and trenches are not ionized and lack a preferred direction (in other words, the velocity distribution of the sputtered neutrals is substantially isotropic). The broad distribution of arrival angles and energy creates a seed layer deposition pattern in which the coating species preferentially coats the upper portion of the trench walls (a so-called overhang) with very little material reaching the bottom of the trench or the lower portions of the trench walls (see FIG. 2A).

Today's semiconductor industry has adopted a version of magnetron sputtering assisted by an inductively coupled plasma (ICP). An electromagnetic coil is immersed in a plasma and an rf signal is applied to the coil thereby creating a secondary plasma that ionises a significant proportion of the sputtered neutrals.

ICP assisted techniques seek to enhance the ionization rate and the directionality of incident coating species by comparison with the conventional magnetron sputtering deposition technique. ICP techniques provide a narrower distribution of arrival angles, which improves the covering the bottom of deep contact holes. Coating of the trench floor and overhang are reduced, however they are still present (see FIG. 2B).

The CVD process is a method of forming dense structure parts or coatings using the decomposition of relatively high vapour pressure gases. Gaseous compounds of the materials to be deposited are transported to a substrate surface where a thermal reaction/deposition occurs. By-products of the reaction are then expelled from the system. The process can generate high purity coatings and is a good conformal process for covering complicated objects. However, the process temperature is usually high (200–1000° C.). With few exceptions, the precursors are corrosive, hygroscopic, air sensitive and toxic. For this reason, the CVD process is generally carried out in closed systems.

The quality of CVD and PVD films is open to considerable improvement and alternative processes are under continual development. One alternative, the Cathodic Arc Deposition process, has received a lot of attention in recent years because of its ability to generate a much higher degree of ionisation than conventional technologies. Using this technique results in films that bond better and have higher density. This technique is normally used to apply wear-resistant coatings to machine tools. However, the substantial distribution of relatively large, typically neutral, multi-atom clusters (often referred to as macroparticles) associated with the process limits its usefulness. Macroparticles are characteristically particles visible under an optical microscope in a film deposited using cathodic arc methods.

During the past few years, a new deposition system, called the Filtered Cathodic Vacuum Arc (FCVA), has been developed. As the name suggests, FCVA includes a filtration step that substantially reduces the number of macroparticles carried with the plasma, thereby facilitating the production of nigh quality coatings and films, including Tetrahedral Amorphous Carbon (ta-C) and $Al_2O_3$ films. During deposition a plasma beam with neutral atoms and macroparticles is emitted from a cathodic arc spot by the cathodic vacuum arc process. The unwanted macroparticles and neutrals are then filtered out by cross-magnetic and electric fields. Only ions within a well-defined energy range are allowed to reach the substrate. High-quality films can be produced by this technique which satisfies the general requirements for all applications—that the deposited films adhere well on a substrate and have good properties that are predictable and reproducible.

Compared to the conventional PVD and CVD techniques, FCVA produces 100% ionised coating species with well-defined and tuneable energy. The technique produces some unique films, such as ta-C film and nigh quality $Al_2O_3$ film, that can not be produced by other techniques.

Filing or coating vias and trenches with copper presents problems for all known deposition techniques. It is therefore an object of the invention to overcome or at least ameliorate the aforementioned problems.

SUMMARY OF THE INVENTION

According to one aspect of the present invention, there is provided a method for forming a conductive region on a first portion of a substrate, the method comprising:

generating a pulsed, modulated electrical bias signal;

applying said bias signal proximate the substrate; and exposing said first portion to a filtered beam of substantially fully ionised metallic ions under influence of said bias signal.

The bias signal applied in the second step may be applied either to a conductor in the neighbourhood of the substrate or directly to the substrate itself.

A filtered beam has a narrow energy distribution and a small range of incidence angles. The last step therefore ensures that trenches or vias in the first portion of the substrate are filled from the bottom upwards, with substantially uniform side wall coating and with a reduced overhang.

The metallic ions are preferably copper ions. Advantageously, the average degree of ionisation is approximately +2.5e. The method has many advantages in that adhesion, nucleation and conformity properties of the copper layer are each much improved over the prior art methods. Furthermore, using a pulsed modulated DC signal to bias FCVA process means that at least some of the stages of copper deposition can be omitted.

Examples of substrates that may be coated in accordance with the present invention include: a polymer (a liquid epoxy or a resin layer), silicon, silicon nitride, or silicon dioxide. In addition to deposition of metallic ions, the present invention can be adapted, through choice of a modulation pattern in the bias signal, to permit polishing and/or etching of the deposited surface.

The step of generating the bias signal advantageously comprises: providing a signal generator having configurable signal characteristics, said signal characteristics including frequency, duty cycle, voltage and deposition time; and configuring the signal characteristics in accordance with a deposition programme. Conveniently this step also includes providing a deposition programme store having a plurality of deposition programmes stored thereupon, determining which of said deposition programmes is required in order to form conductive region, accessing said predetermined deposition programme from said programme store, and configuring the signal characteristics in accordance with said predetermined deposition programme. The deposition programme may be provided by a feedback loop, in which case the feedback loop would feed deposition status information back to the bias signal generator.

The method of the invention may also include the step of removing excess copper by re-sputtering.

Advantageously, the plasma team is collimated so that the beam impacts the substrate in a direction substantially orthogonal to the substrate plane.

According to another aspect of the present invention, there is provided a method for forming a conductive region on a first portion of a substrate, the method comprising: generating a substantially pure plasma beam including positively charged metallic ions from a cathode target; passing the beam towards the substrate through a plasma duct having a first bend with an angle of no less than 20° in a first plane and a second bend with an angle of no less than 20° in a second plane, thereby filtering unwanted particles from the beam; and exposing said first portion of the substrate to the filtered beam under a pulsed, modulated electrical bias.

By using pulsed, modulated wave patterns to bias the substrate in the FCVA process to deposit copper particles, the number of copper deposition process stages is reduced (activation/electroless plating to form seed layer and electroplating processes are replaced by a single process).

In one embodiment, the use of FVCA even removes the need for a final CMP stage altogether, by allowing resputtering to remove excess copper. This reduction in stages results in savings on equipment investment and more importantly provides a much more environmentally friendly process overall.

While a separate barrier formation stage is necessary to prevent diffusion of copper into the underlying substrate, FCVA can be used as an alternative technique for depositing the barrier layer. To this end, a target material suitable for barrier formation (for example Ta, Ti or W (with and without nitrogen)) must be used.

According to a further aspect of the present invention, there is provided an apparatus for forming a conductive region on a first portion of a substrate, the apparatus comprising: a plasma generator, which generates a plasma beam including positively charged ions from a cathode target; a filter duct, which filters unwanted particles from the ion beam said duct having two bends such that there is no line of sight and no single bounce path through the duct; a beam steering arrangement, which steers the plasma beam through the duct and onto the substrate; and a beam biasing arrangement, for applying a pulsed, modulated electrical bias to the filtered plasma beam.

The present invention is not limited to current trench and via standards, the FVCA process can be applied to the narrower target trench widths expected in next generation semiconductor applications. Nor is the invention limited to the deposition of copper, as mentioned earlier silver deposition may also be achieved.

BRIEF DESCRIPTION OF THE DRAWINGS

Examples of the present invention will now be described in detail with reference to the accompanying drawings, in which.

DETAILED DESCRIPTION

Figure 1A:
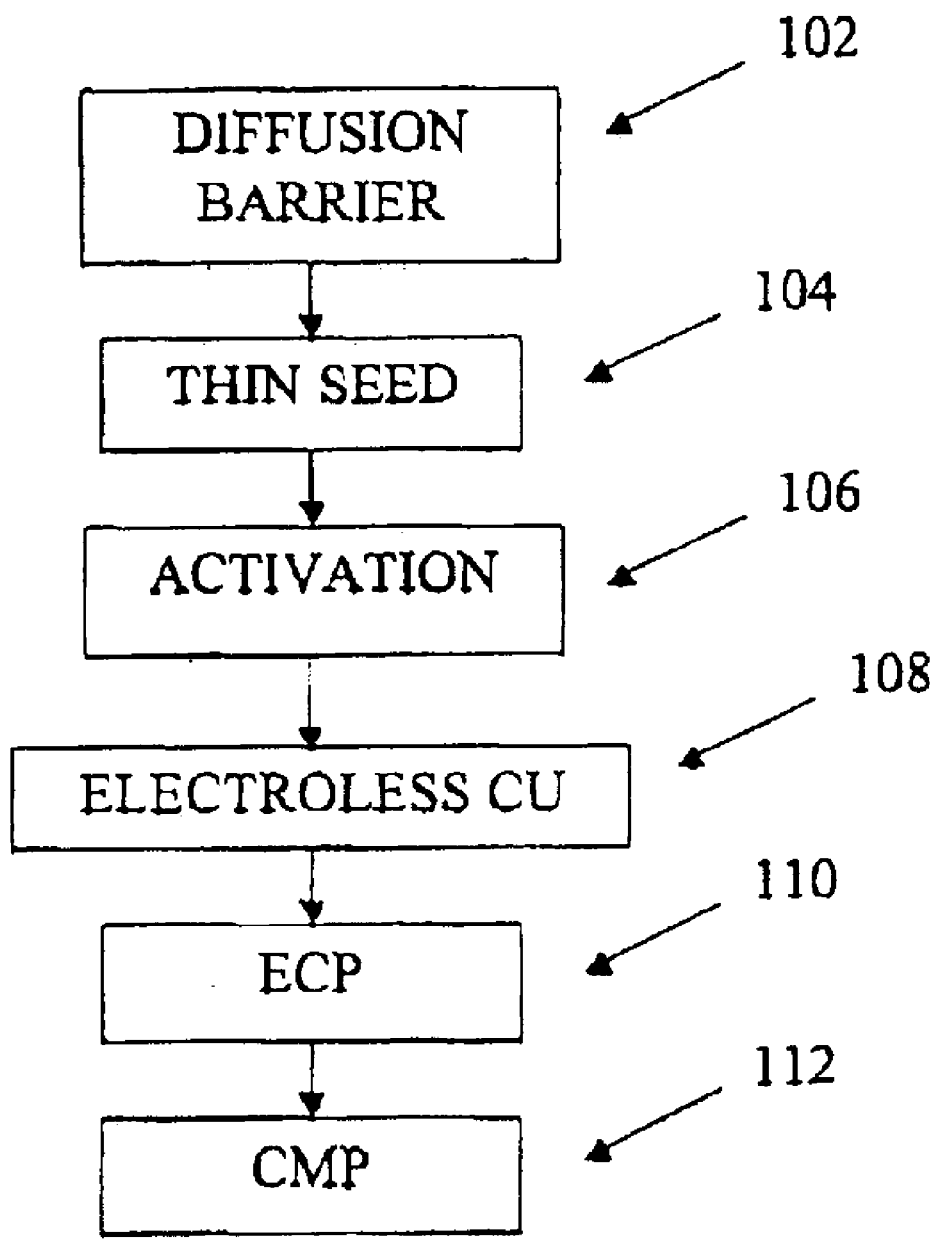
FIG. 1A shows the prior art process of copper deposition.
Figure 1B:
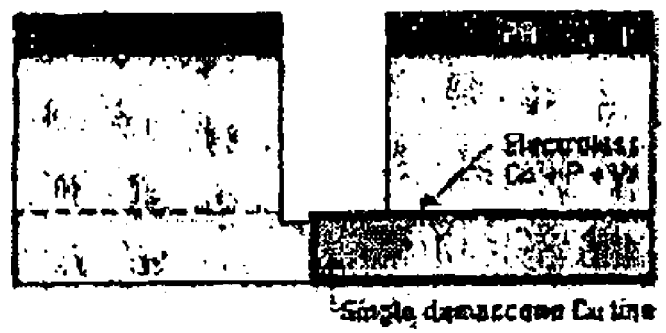
FIG. 1B shows stages of the process in FIG. 1A when applied to filling a via.
Figure 1B:
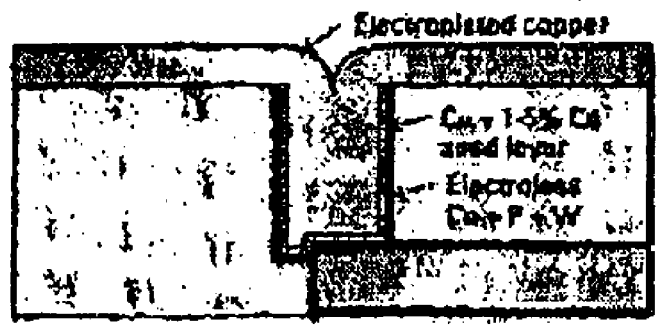
Figure 1B:
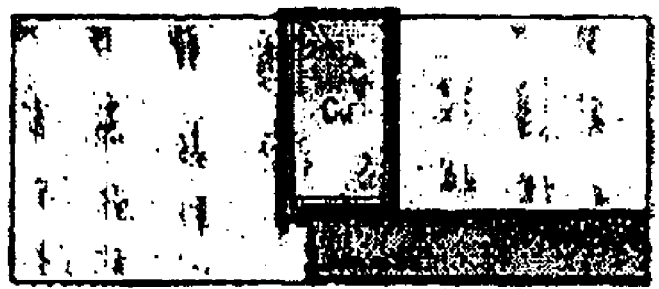
Figure 2A:
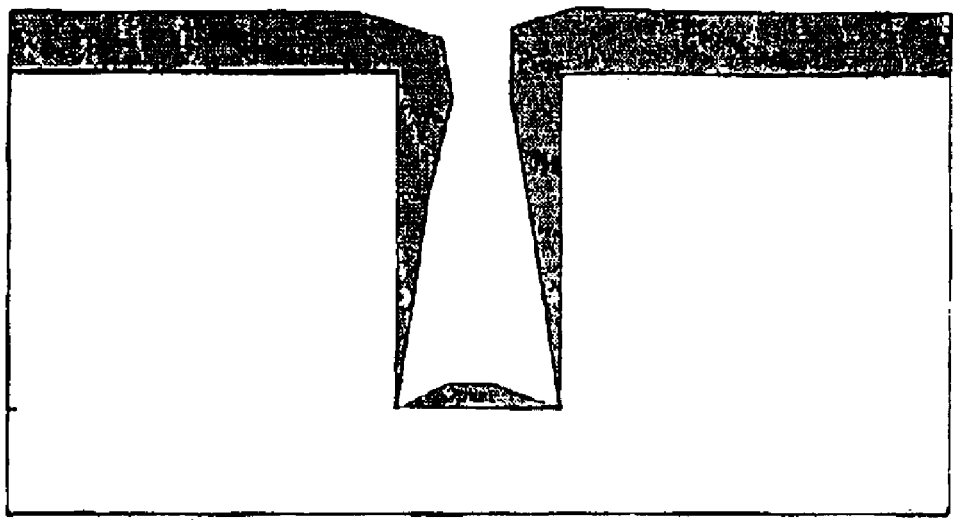
FIGS. 2A and 2B show the deposition pattern resulting from conventional magnetron sputtering and ion assisted sputtering respectively.
Figure 2B:
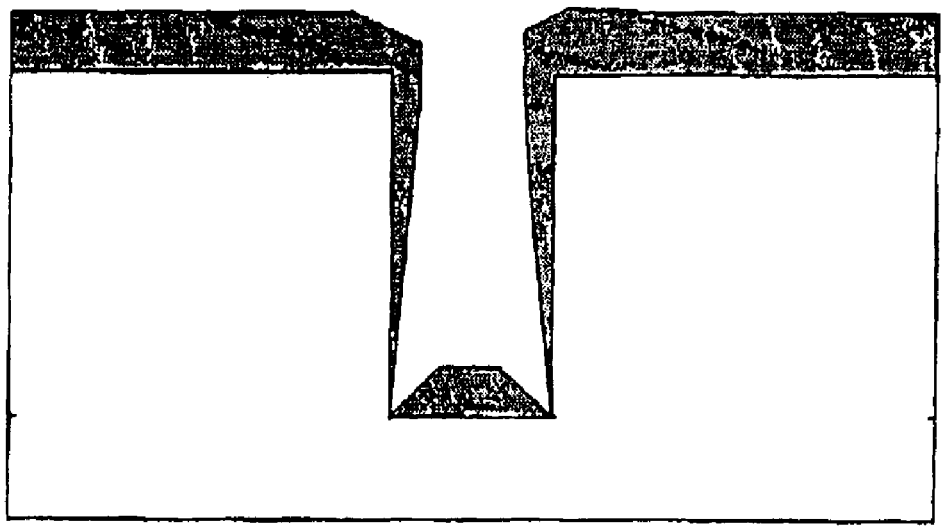

Using positive ions generated from a cathodic arc source in a vacuum to deposit thin films is known for hard coatings such as ta-C and $Al_2O_3$.

The cathodic arc is a form of electrical discharge in vacuum which is sustained in metal plasma created by the arc alone and does not require the addition of an inert gas. Currents used in cathodic arc systems are typically of the order of 100 amps, at around 28 volts. A large percentage of the metal vapour generated by the arc is ionised by the discharge and a fraction of the arc current escapes as a plasma beam that includes positively charged ions; this fraction is steered and optionally filtered to produce a coating on a distal substrate. The increased energy of these positive ions compared to the particles in previous deposition methods is thought to be a reason why arc evaporation techniques would deposit high density, high adhesion films. Deposition of thin films by filtered arc evaporation is described generally by P. J. Martin in Surface and Coatings Technology, Volumes 54/55 (1992) pages 136–142, and further reviewed in Surface Engineering, Volume 9 (1993), no. 1, pages 51–57.

FCVA improves upon other cathodic vacuum arc systems in addressing the requirements needed for industrial applications. For example FCVA can be made automatic and easily maintained and can produce a large coating area, free of blemishes.

By filtering macroparticles from the plasma beam, FCVA thereby eliminates the undesirable side effects of the presence of macroparticles in the deposited coating. FCVA apparatus enables the production of coatings known in the art with improved coating properties due to the improved purity thereof.

Deposition of copper or aluminium with FCVA requires careful arrangement of the deposition apparatus. The cathode target is arranged substantially horizontally, with the plasma beam of positive tons emitted substantially vertically therefrom. The cathode target is retained by a guide. This arrangement allows the cathode target to melt during preparation of the cathodic arc and therefore this arrangement is suitable for use with low melting point targets such as copper and aluminium.

Prior to FCVA, cathodic arc sources were not suitable for use with low-melting point targets for various reasons. Firstly, the layout of the cathodic arc source forced the target to be held vertically or at an angle to the horizontal, so that if a low melting point target were used it would melt and flow away from the cathode station and drip on to the walls or the bottom of the source. Secondly, production of macroparticles from a molten cathode target is higher than from a solid cathode target. The prior art devices did not provide an efficient enough filter of macroparticles to enable acceptable quality coatings of low melting point metals to be obtained from a molten cathode.

In FCVA, the anode is preferably water-cooled and the cathodic arc source used for long periods, ranging from a few minutes to several hours in duration. As a result coatings of low-melting point cathodes, and in particular copper cathodes, can be obtained using the apparatus.

Figure 3:
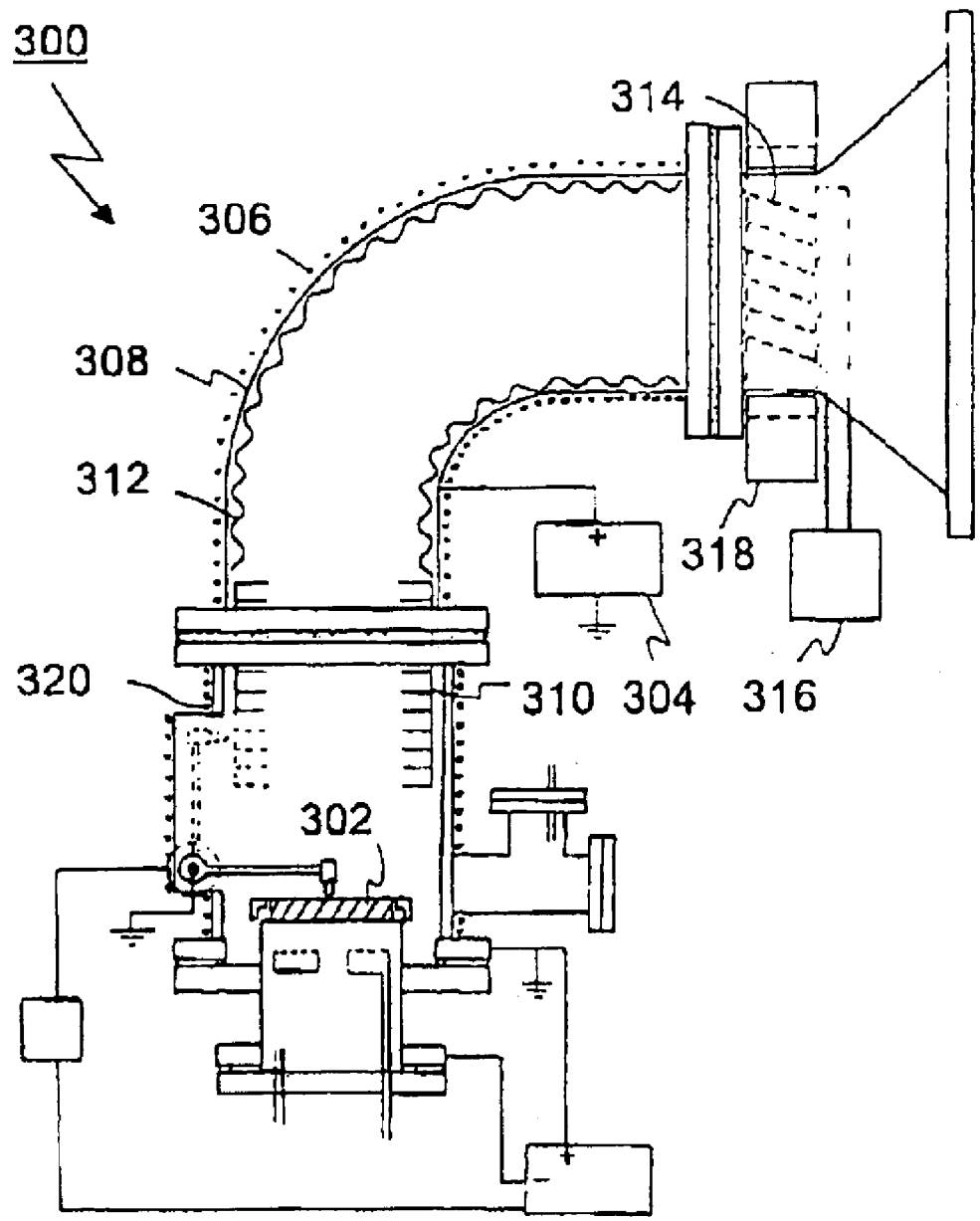
FIG. 3 shows a FCVA vapour deposition device for generating a filtered plasma beam.

The FCVA device shown in FIG. 3 is more fully described in International patent application WO 96/26531. For present purposes the device can be described as follows.

In FIG. 3, a filtered cathodic vacuum arc apparatus 300 generates pure plasmas to deposit dense and clean thin films on a substrate. The plasma is emitted from cathodic arc spots on the surface of a consumable cathode 302 and guided by a radial electric field (generated by a bias power supply 304) and a curvilinear axial magnetic field (generated by a magnetic coil 306) through a positively biased double bend toroidal duct 308 to the substrate in a coating vacuum chamber. Unwanted macroparticles emitted with the plasma from the cathode are effectively filtered out by a set of removable ceramic baffles 310, a removable stainless steel bellows 312 and the double bend toroidal duct 308.

The clean plasma beam, virtually without macro-panicles at the exit of the duct 314, can be scanned in one dimension by a beam scanning system 316,318. This scanned beam, in combination with a rotating substrate holder in the coating vacuum chamber, can deposit a film over a large area with good uniformity, where the temperature of the substrate is, for example, room temperature. Alternatively, the beam scanning system 316,318 may be arranged to provide uniform scanning in two dimensions. The alternative scanning system may be provided in association with either a stationary holder or a rotating substrate holder. In the later case the substrate can be in excess of 30–40 cm in diameter. Ions of the deposited material with a desired energy can be extracted from the plasma beam by using a DC or RF bias on various types of substrates, such as metals, semiconductors, plastics, ceramics and glasses.

Figure 4:
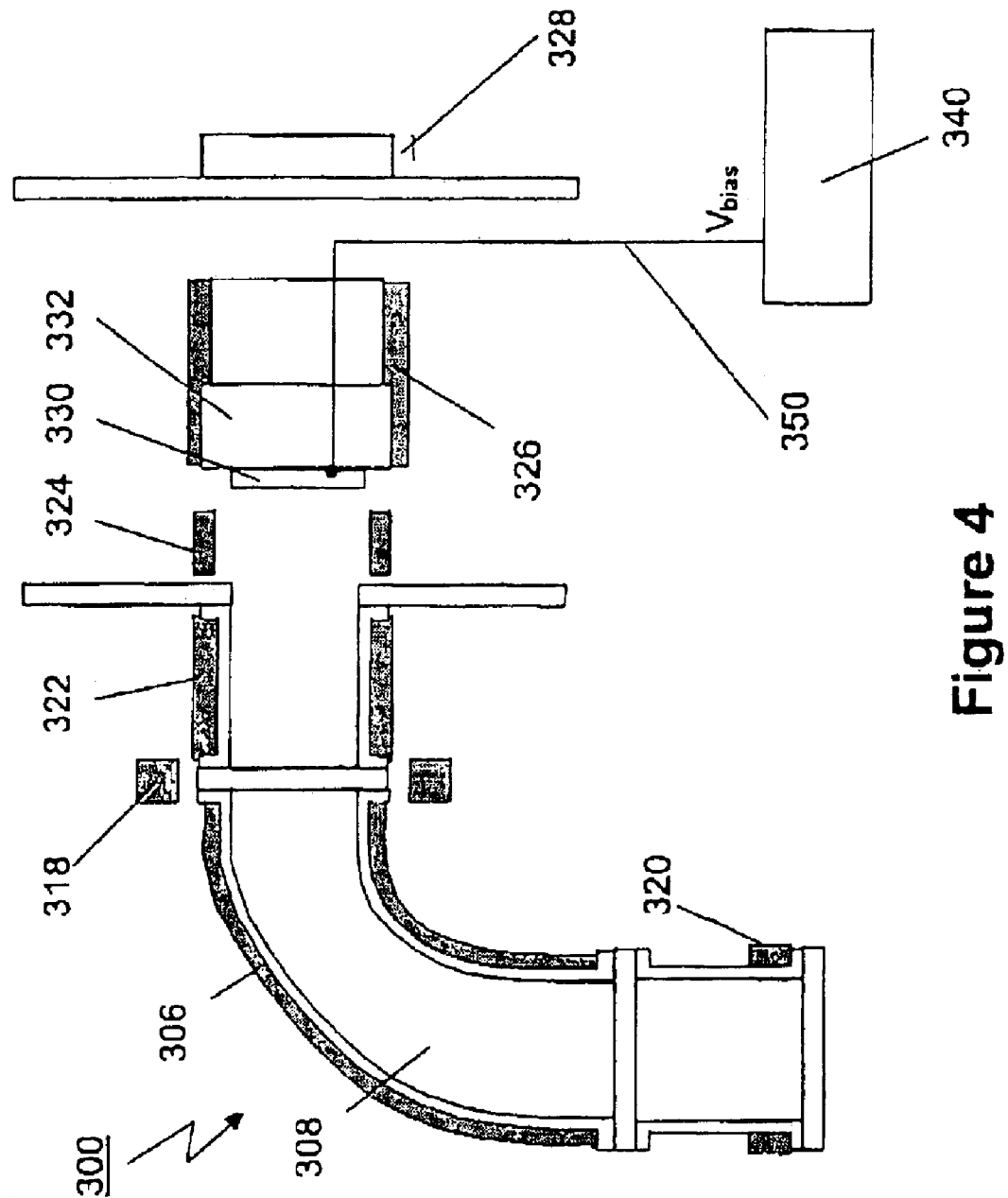
FIG. 4 shows an adapted FCVA vapour deposition device in accordance with the invention.

FIG. 4 shows schematically how the plasma is generated from a target material disposed at a first end of a double bend filter duct 320. Where features correspond to features of FIG. 3, identical reference signs are used.

The cathodic target is surrounded by an anode coil 320. The magnetic coil 306 along the length of the filter duct 308 is referred to as the filter coil 306 and serves in combination with the radial electric field to filter out unwanted contaminants, such as macroparticles and plasma particles having energies falling outside a predetermined energy range.

Collective behaviour of the plasma emerging from the filter duct 308 is influenced by the magnetic field induced by three further coils: a scanning coil 318; a focussing coil 322; and an extension coil 324.

Thereafter, the magnetic field is controlled to direct a substantially fully ionised plasma onto a substrate 330.

Additional coils are provided to control the incident ions; the additional coils including a holder extension coil 326 and (optionally) a rear extension coil 328. A bias signal module 340 applies a pulsed, modulated bias signal 350 to the substrate 330 or a substrate holder 332.

In the FCVA device discussed in WO 96/26531, a bias is applied to the substrate holder 332 in order to dissipate electrostatic charge accruing on the substrate due to the deposition of positive ions. The bias there is neither pulsed nor modulated.

Figure 6:
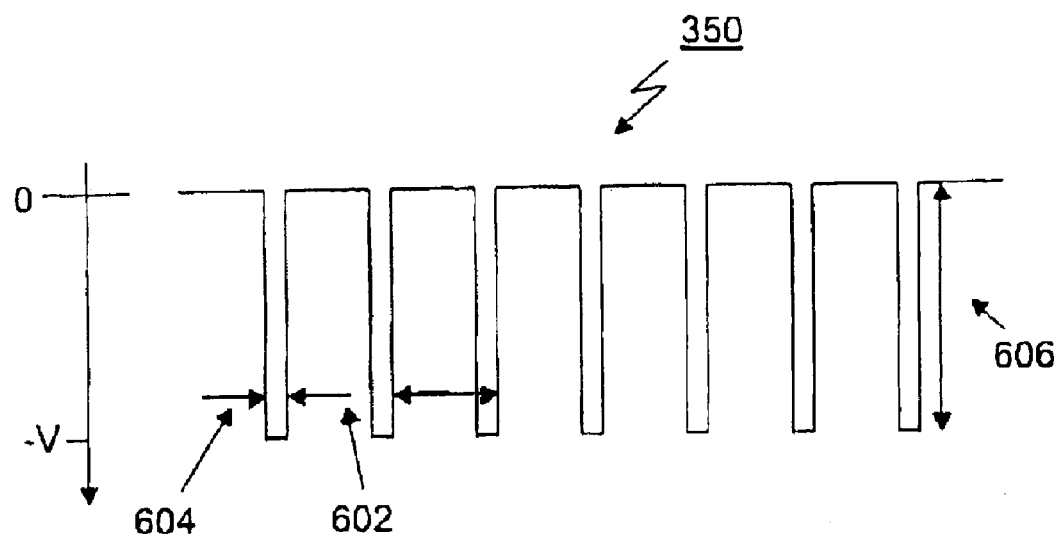
FIG. 6 illustrates a DC pulsed pattern with constant peal voltage.

In one aspect of the present invention, the bias signal module 340 includes a DC pulsed generator. In alternative embodiments, the bias signal 350 applied to the substrate is bipolar pulsed or RF modulated. As shown in FIG. 6, the bias signal 350 is typically a negative bias having a frequency 602 in a range from 20 to 200 kHz and a duty cycle of anywhere between 20 and 95%. The pulse duration 604 is therefore of the order of microseconds ($\mu$s). Peak voltage (−V) 606 has a constant value in this Figure but may be varied under the control of a programmable logic controller (PLC).

Figure 5:
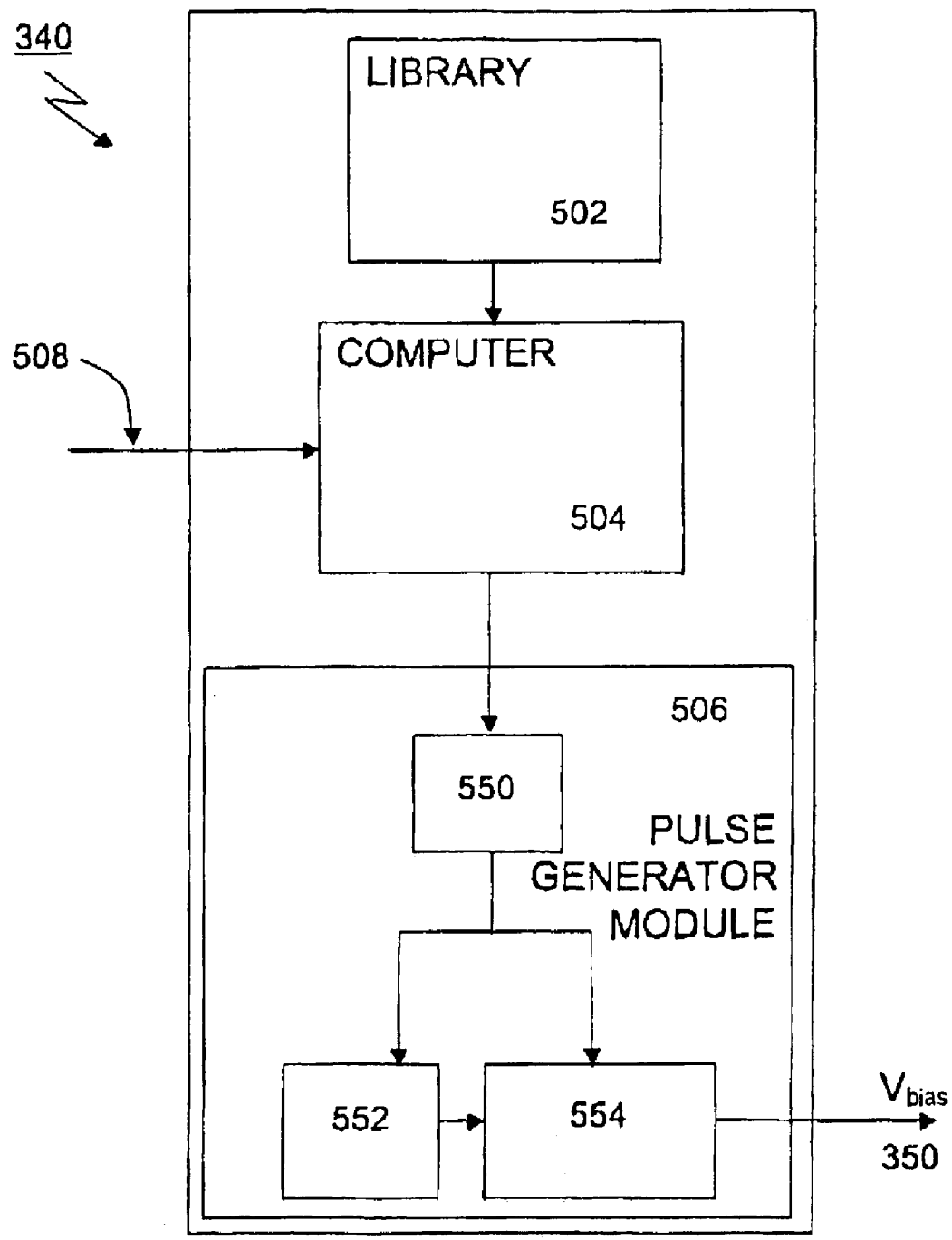
FIG. 5 shows the components of a bias signal module for generating a pulsed, modulated bias signal.

FIG. 5 illustrates a bias signal module 340 for generating the pulsed, modulated bias signal 350. A suitable pulse generator module 506 comprises a DC power supply 552 (with a peak voltage of the order of 1000V), a switching circuit 554 (typically an arrangement of transistors) and a PLC 550. The power supply 552 outputs a DC signal to the output of the pulse generator 506 via the switching circuit 554. The PLC 550 is coupled to both power supply 552 and switching circuit 554 and defines the frequency and duty cycle at which the switching circuit 554 is to switch the output signal. The PLC 550 also instructs the power supply 552 what value of the peak voltage to operate at. According to the output of the PLC 550, the peak voltage (−V) generated by the power supply 552 can be made to vary over a predetermined number of frequency cycles (the peak voltage may be as little as 50 V or more).

Figure 7A:
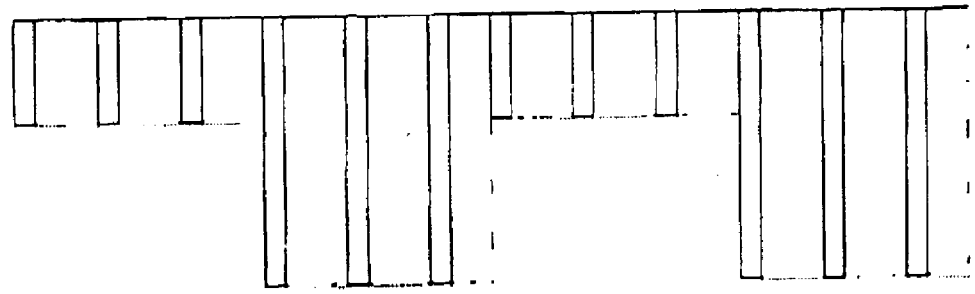
FIGS. 7A to 7C illustrate modulation patterns corresponding to deposition programs in accordance with a further aspect of the present invention.
Figure 7B:
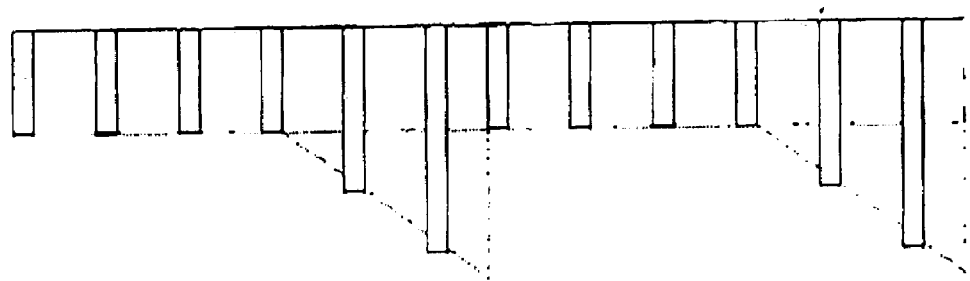
Figure 7C:
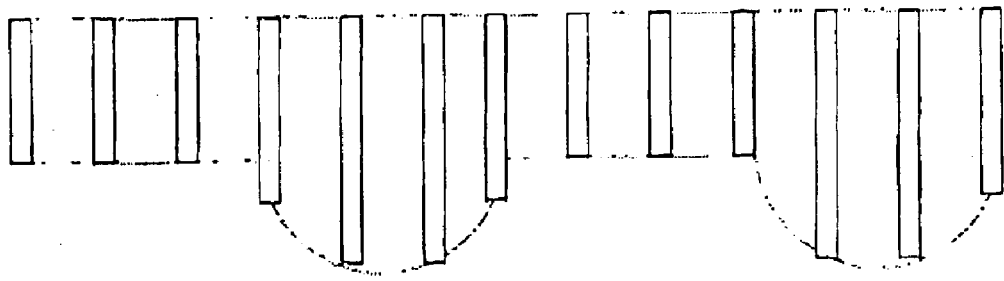

The PLC 550 can itself be controlled by a processing device 504, for example a computer. The processing device 504 outputs a sequence of commands, each of which corresponds to a required power supply and switching circuit setting. The processing device 504 may be under the direct control of a user 508, however it has been found advantageous to build a library 502 of appropriate programs of PLC commands. These programs result in modulated output signal patterns, for example the step pattern of FIG. 7A, the saw tooth pattern of FIG. 7B and the half sinusoidal pattern of FIG. 7C.

The library 502 of programs may be stored in an electronic database and accessed by the processing device 504. Any given program, "recipe" of patterns, when applied to the PLC 550 by the processing device 504, achieves a specific deposition effect on the substrate: for example the formation of a thin copper film on the substrate or the filling of a high aspect ratio trench or via. Each program may be constructed as a number of tables of values of operating parameters, for instance peak voltage, duty cycle and frequency. For each operating parameter, the table contains required values of that parameter at a number of successive times: $t_1, t_2, \ldots t_n$. Each program (recipe) therefore defines the values of each parameter required at any given time during a predetermined deposition period, T. The choice of which program to execute may also be directly controlled by the user, the user choosing the program according to the desired deposition effect. The execution of programs may alternatively be automated.

The programs stored in the library 502 correspond to different waveform patterns which in turn have corresponding effects upon characteristics of the incident plasma beam. Examples of plasma beam characteristics effected include:

the ion energy upon impact upon either trench or substrate surface;

the ratio of deposition and re-sputtering rate;

the characteristic of trench filling (i.e. whether the arriving ions form an overhang or a conformal coating or indeed fill trenches from "bottom up"); and, the uniformity and thickness of the coating.

As mentioned above, important operating parameters include voltage levels; waveform shape and frequency; duty cycle; and deposition time. The minimum voltage and the maximum voltage can both be important parameters, with a range of values being between ground and 1000 volts, more typically ranging between floating and 300 volts. A preferred embodiment of the present invention operates with voltages in the range 100V to 300V. Within any one waveform pattern there may be a plurality of different predetermined voltage set points, see for example the saw tooth pattern of FIG. 7B.

Duty cycle may vary from 20% to 95% but typically values in the range of between 70% and 90% are chosen. The preferred range for pulse frequency is between 20 KHz and 200 kHz, a frequency of 50 kHz to 100 kHz being typical. The frequency of the enveloping (or modulating) waveform ranges between 0.1 to 1000 Hz.

Figure 8:
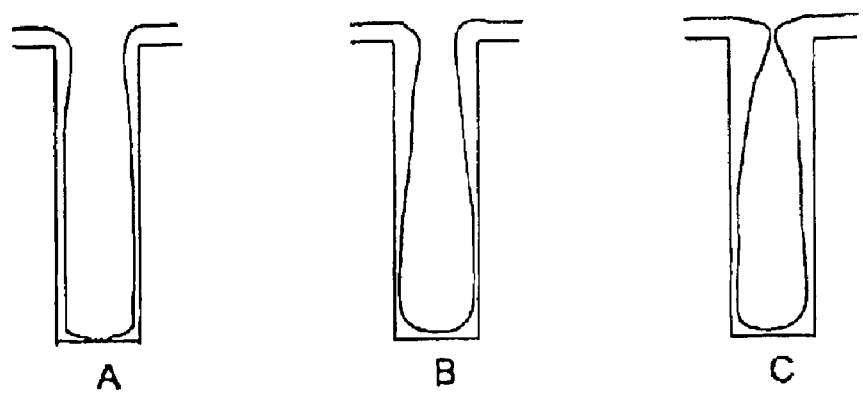
FIG. 8 shows the deposition of copper over time in a high aspect ratio via with only a floating bias.
Figure 9:
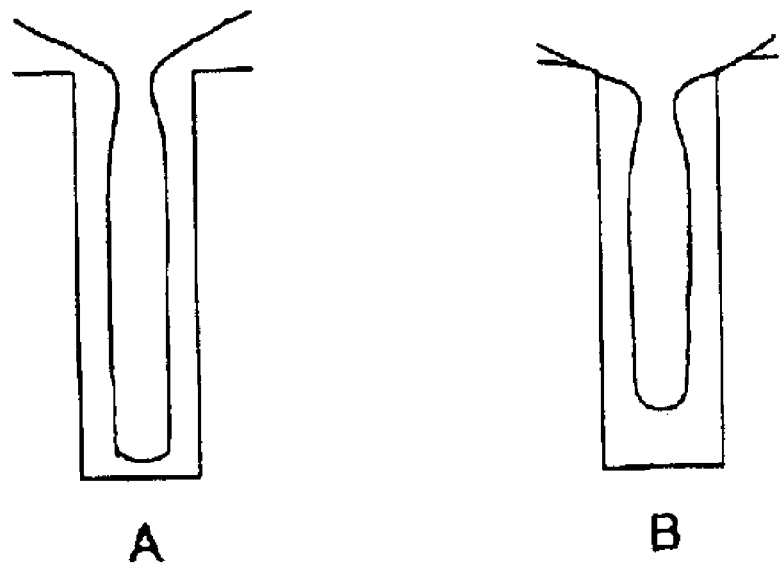
FIG. 9 shows the effect of a substrate bias of 180 volts in accordance with the invention.
Figure 10:
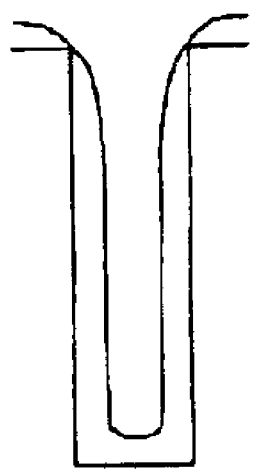
FIG. 10 shows the effect of a substrate bias of 220 volts in accordance with the invention.

FIGS. 8 through 10 illustrate the effect of an increasing holder biasing potential. In each Figure the effect of the biasing potential 350 is illustrated for a via formed on a substrate 330 held by the substrate holder 332.

FIGS. 8A to 8C show the development over time of a copper layer in the via when the substrate holder is not biased and has a floating potential (FIG. 8A being the earliest). As may be appreciated, the neck of the via is almost pinched in the last Figure in the series. This is not desirable since this creates voids that contribute to overheating in electronic components. The coating in the remainder of the via is unlikely to have the thickness generally required in the industry.

FIGS. 9A and 9B show the effect of a substrate bias of 180 volts (at a frequency of 50 kHz and with a duty cycle of 85%). Initially deposition effects dominate, and the neck of the via is noticeably pinched. The bias encourages the resputtering of the copper material. Resputtering may be considered as the non-adhesion of incoming material to the previously coated material. Resputtering is at its most efficient when the incoming materials are of the same species as the material on the substrate. Continuing exposure results in the distribution pattern shown in FIG. 9B. Here, sputtering and deposition effects combine to give a satisfactory neck profile and sufficiently thick sidewall and bottom filling.

FIG. 10 shows the effect of re-sputtering with a higher biasing voltage again (220 volts). Again the frequency and duty cycle are 50 kHz and 85% as for the bias profile illustrated in FIG. 9. By using a yet higher biasing voltage, the deposition effects are relatively weaker than the resputtering and the neck of the via is scarcely pinched at all. Resputtering ensures that the required thickness of coating is applied on the sidewall and bottom of the via.

The conditions in FIGS. 9 and 10 illustrate how the coating profile can be reshaped by adjusting the bias condition. Different surface conditions and/or via aspect ratios may need different biasing regimes. As a consequence, it is important to build a library of bias profiles appropriate to prevailing conditions.

Figure 11A:
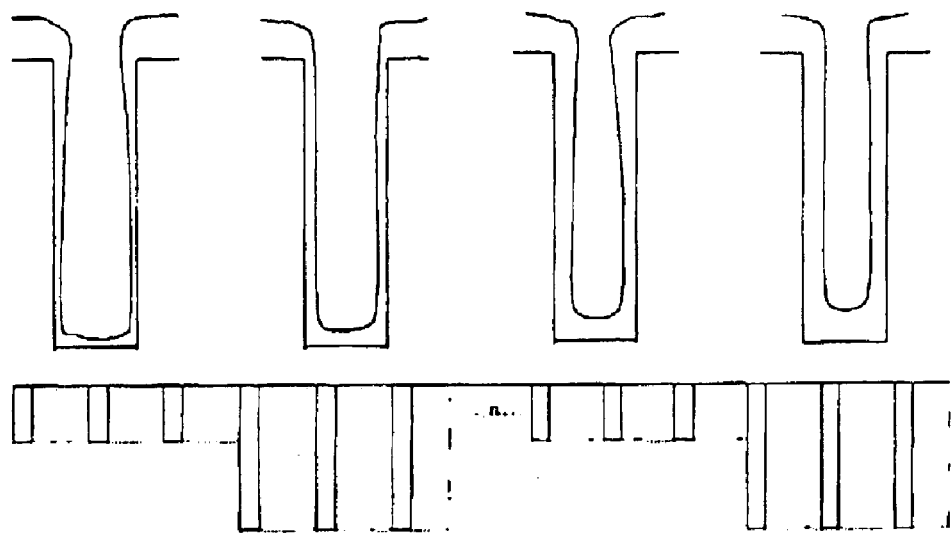
FIG. 11A shows the laying down of a side wall seed layer coating using a first pulsed, modulated bias signal.
Figure 11B:
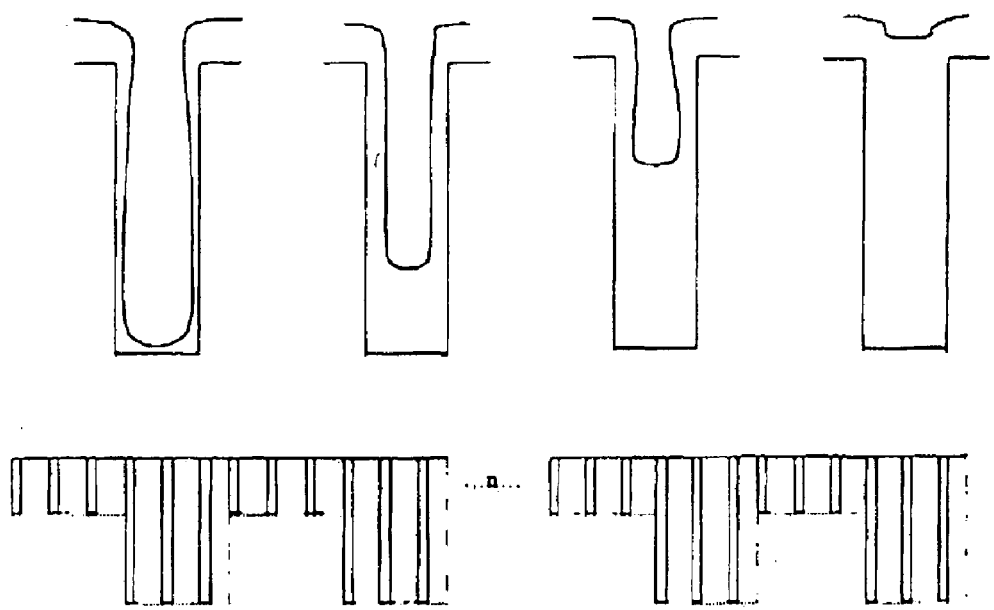
FIG. 11B shows the filling of a trench using a second pulsed, modulated bias signal.

Using a library of appropriate modulation patterns, high aspect ratio trenches can either be coated with a side wall seed layer as shown in FIG. 11A or completely filled as shown in FIG. 11B. FIGS. 11A and 11B show pulses having the same frequency but operating over differing lengths of time. FIG. 11B shows the results of operation for a substantially longer time than FIG. 11A. The increased number of pulses is seen to encourage resputtering and therefore the filling of holes. The frequency of operation of the biasing voltage can itself be varied as can the peak voltage and the duty cycle.

As the substrate area increases, the angle of incidence of the ion beam strays significantly from normal incidence. For example when disposing copper at the edge of a 30 cm diameter substrate the angle of incidence can be reduced to 75 degrees. Angle of incidence is predominantly defined by the direction of magnetic field lines.

Figure 12:
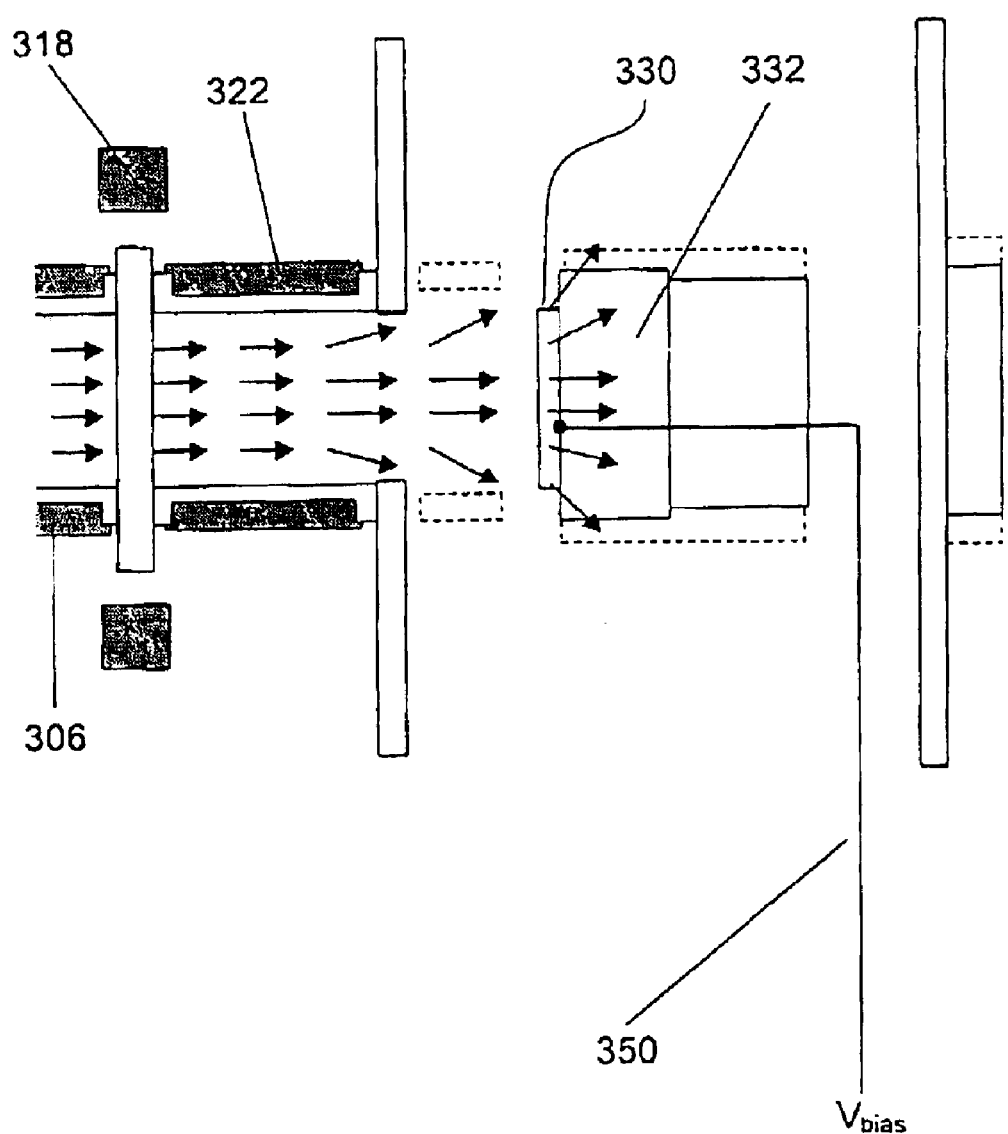
FIG. 12 shows the direction of magnetic field lines in an uncollimated coil arrangement.

FIG. 12 illustrates now the magnetic filed behaves in a coil arrangement without compensation. The magnetic field lines in the coil arrangement begin to diverge at some distance from the substrate. The ions in the incident ion beam are substantially bound to the diverging magnetic field lines (trapped) and therefore move substantially parallel to the magnetic field lines.

Since the plasma beam is generated by the FCVA device, the beam will be substantially wholly ionised. In the absence of neutral particles, substantially the whole beam is trapped by diverging magnetic field lines.

Figure 13:
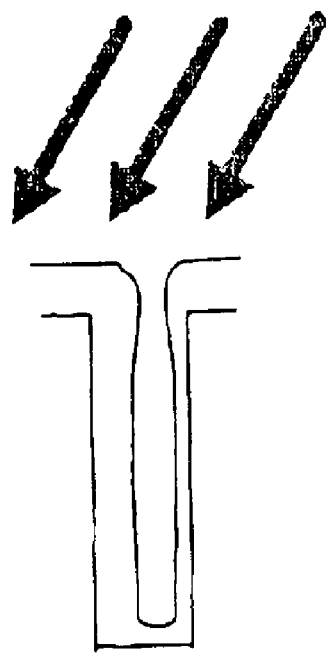
FIG. 13 shows an unevenly filled via showing evidence of 'shadowing'.

The effect of a non-ideal incident angle on the filling of a via is illustrated in FIG. 13, where the right hand side of the via has been shadowed by the right hand nm of the via resulting in a thinner deposition of material on the shadowed side. The magnetic field lines are directed from top right to bottom left: the direction of incidence is substantially parallel to the field lines.

Figure 14:
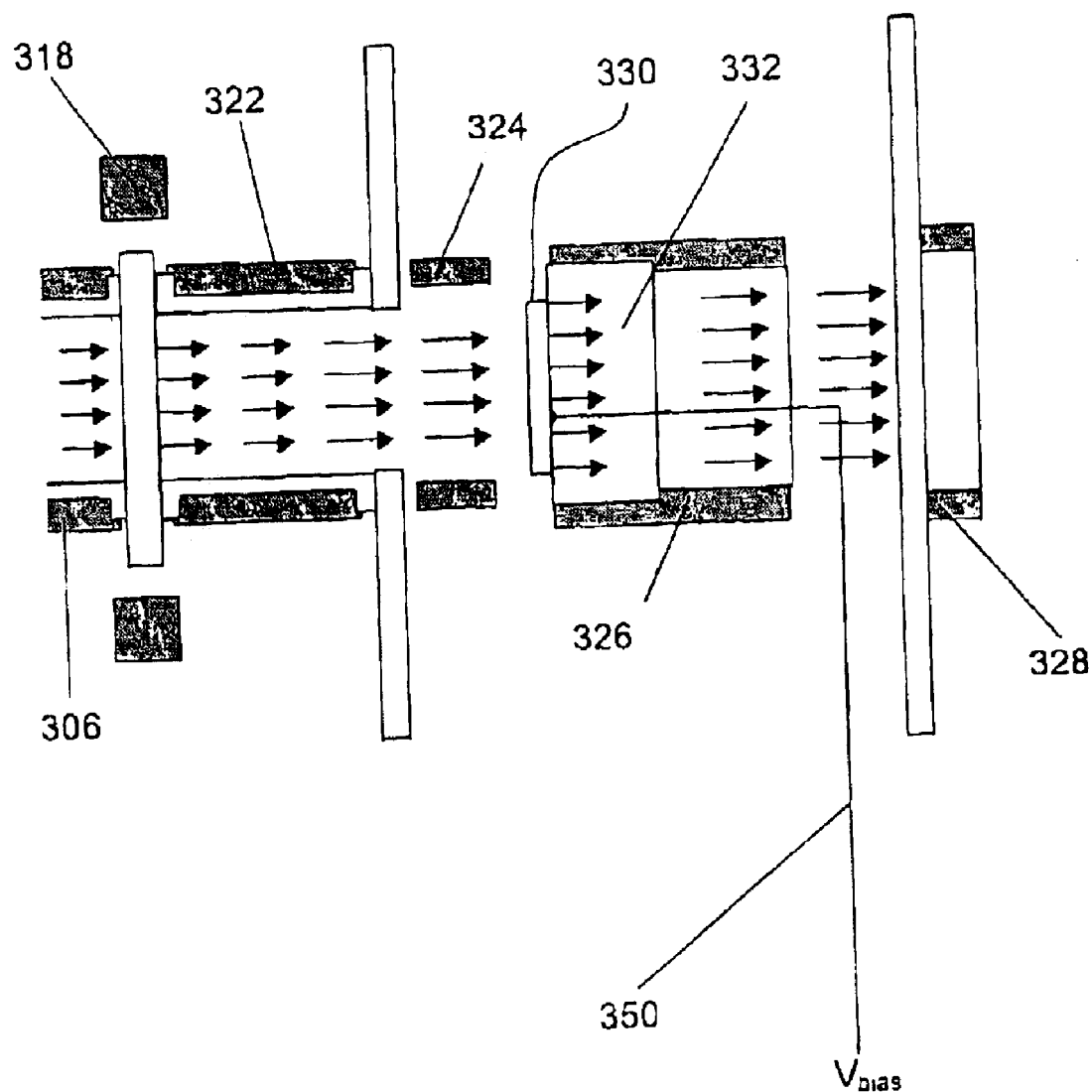
FIG. 14 shows the direction of magnetic field lines in a collimated coil arrangement.

In order to ensure conformal deposition of copper, the magnetic field lines at the substrate surface are ideally normal to the plane of the substrate surface even at the outer edges of the substrate. Therefore, in another aspect of the present invention, collimator coils are added to guide the plasma beam. These coils, in particular the extension coil 324, the holder extension coil 326 and the rear extension coil 328, are illustrated in FIG. 4 and in more detail in FIG. 14. The extension coils are preferably water-cooled to ensure reliable operation.

By controlling the current applied to the extension coil 324, the holder extension coil 326 and the rear extension coil 328, the ideal field profile can be more nearly approximated. The plasma beam, confined by the field lines, impacts on the substrate in a direction substantially orthogonal to the substrate plane: even high aspect ratio vias are filled or coated conformally with no appreciable 'shadowing' effect.

In operation, the extension coil current is preset to induce a magnetic field directed from the exit of the FCVA source to the substrate. For the deposition of copper ions, this ensures that Cu ions have a narrow range of incidence angles at the substrate surface. The typical field strength ranges from 20 to 100 mT. Although the current in the extension coil is not generally adjusted during deposition, this current may be adjusted when required. The magnetic field due to the extension coils is typically independent of the electrical bias.

As the plasma beam is fully ionised, the beam is trapped into the orthogonal incidence angle imposed by the magnetic field lines. The resulting beam is collimated and narrow, leading to a uniform coating on the side walls and across the surface of the substrate.

Figure 15:
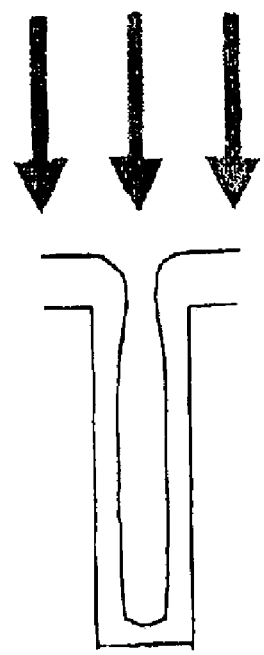
FIG. 15 snows an evenly filled via using the collimated coil arrangement of FIG. 14.

FIG. 15 illustrates the coating formed using a normally incident collimated beam of ions. As required the coating is of equal thickness on either side of the via.

The collimator coils and the bias voltage applied to the substrate co-operate to encourage resputtering of the copper already on the substrate. Sufficient resputtering removes any excess copper and thereby renders CMP 112 effectively redundant (see FIG. 1).

FCVA technology can serve in place of yet another stage of the conventional process flow. Referring once more to FIG. 1A, the very first step in the process flow is the preparation of the substrate with the deposition of a barrier layer 102. As discussed earlier, this layer is typically deposited with CVD or PVD. Using either the same (copper depositing) FCVA device or a second dedicated FCVA device with a target material of Ta, Ti or W (with and without nitrogen), FCVA technology could be used to replace the existing barrier layer deposition process (either CVD or PVD).

As an alternative source of a modulated, pulsed bias signal, the bias signal module 340 (see FIG. 4) may include an RF generator. The bias signal is then RF modulated. The RF bias signal module 340 further comprises a processing device coupled to a database of deposition programs and a matching network. The programs in the RF database correspond to parameters necessary for RF operation, for example RF power settings and total required deposition time. The RF generator includes a PLC and the processing device sends required parameter settings to the PLC. Signals are generated by the RF generator in accordance to these parameter settings and the output is applied to the substrate via the matching network.

What is claimed is:

1. A method for forming a conductive region on a first portion of a substrate, the method comprising:
   generating a pulsed, amplitude modulated electrical bias signal;
   applying said bias signal proximate the substrate; and
   exposing said first portion to a filtered beam of substantially fully ionized metallic ions under influence of said bias signal; wherein
   generating said bias signal comprises:
   providing a signal generator having configurable signal characteristics, said signal characteristics including frequency, duty cycle, peak voltage and deposition time; and
   configuring the signal characteristics in accordance with a deposition program.

2. A method as claimed in claim 1, wherein the metallic ions are copper ions.

3. A method as claimed in claim 2, wherein the average degree of ionisation of said copper ions is approximately +2.5e.

4. A method as claimed in claim 2, further comprising the step of removing excess copper by resputtering.

5. A method as claimed in claim 1, wherein the pulsed, amplitude modulated electrical bias signal has a frequency in the range 50 to 100 kHz.

6. A method as claimed in claim 1, wherein the pulsed, amplitude modulated electrical bias signal has a frequency of 50 kHz.

7. A method as claimed in claim 1, wherein the pulsed, amplitude modulated electrical bias signal has a duty cycle in the range 20 to 95 percent.

8. A method as claimed in claim 1, wherein the pulsed, amplitude modulated electrical bias signal has a duty cycle in the range 70 to 90 percent.

9. A method as claimed in claim 1, wherein the pulsed, amplitude modulated electrical bias signal has a duty cycle of 85 percent.

10. A method as claimed in claim 1, wherein the pulsed, amplitude modulated electrical bias signal has a peak voltage greater than 50V.

11. A method as claimed in claim 10, wherein the pulsed, amplitude modulated electrical bias signal has a peak voltage greater than or equal to 120V.

12. A method as claimed in claim 11, wherein the pulsed, amplitude modulated electrical bias signal has a peak voltage greater than or equal to 220V.

13. A method as claimed in claim 1, wherein the pulsed, amplitude modulated electrical bias signal has a voltage in the range from ground to 300V.

14. A method as claimed in claim 13, wherein the pulsed, amplitude modulated electrical bias signal has a voltage in the range from 100 to 300V.

15. A method as claimed in claim 1, wherein the pulsed, amplitude modulated electrical bias signal has a frequency in the range 20 to 200 kHz.

16. A method as claimed in claim 1, wherein generating said bias signal further comprises:
   providing a deposition program store having a plurality of deposition programs stored thereupon;
   determining which of said deposition programs is required in order to form the conductive region;
   accessing said predetermined deposition program from said program store; and
   configuring the signal characteristics in accordance with said predetermined deposition program.

17. A method as claimed in claim 1, wherein the deposition program is provided by a feedback loop, said feedback loop feeding deposition status information back to the bias signal generator.

18. A method as claimed in claim 1, wherein the first portion of the substrate incorporates a via and wherein the method forms a conductive region in said via.

19. A method as claimed in claim 1, further comprising collimating the plasma so that the plasma impacts the substrate in a direction substantially orthogonal to the substrate plane.

20. A method for forming a conductive region on a first portion of a substrate, the method comprising:
   generating a substantially pure plasma beam including positively charged metallic ions from a cathode target;
   passing the beam towards the substrate through a plasma duct having a first bend with an angle of no less than 20° in a first plane and a second bend with an angle of no less than 20° in a second plane, thereby filtering unwanted particles from the beam; and
   exposing said first portion of the substrate to the filtered beam under a pulsed, amplitude modulated electrical bias, wherein said electrical bias is generated by:
   providing a signal generator having configurable signal characteristics, said signal characteristics including frequency, duty cycle, peak voltage and deposition time; and
   configuring the signal characteristics in accordance with a deposition program.

21. An apparatus for forming a conductive region on a first portion of a substrate, the apparatus comprising:
   a plasma generator, which generates a plasma beam including positively charged ions from a cathode target;
   a filter duct, which filters unwanted particles from the ion beam said duct having two bends such that there is no line of sight and no single bounce path through the duct;

a beam steering arrangement, which steers the plasma beam through the duct and onto the substrate; and a beam biasing arrangement for applying a pulsed, amplitude modulated etectrical bias to the filtered plasma beam; wherein the biasing arrangement comprises a procesing device and a pulse generator module, the pulse generator module generating the pulsed, amplitude modulated electrical bias under the control of the processing device in which the pulse generator module includes a programmable logic device, a power supply and a switching circuit, the switching circuit being controlled by the programmable logic device and an output of the power supply being coupled to the substrate via the switching circuit, wherein the programmable logic device controls the operation of both the power supply and the switching circuit.

22. An apparatus as claimed in claim 21, wherein the apparatus further comprises a substrate holder for holding the substrate in the filtered plasma beam; and wherein the biasing arrangement operates both to dissipate electrostatic charge accruing on the substrate due to the deposition of positive ions and to ensure that the energy of incident ions falls in a predetermined energy range.

23. An apparatus as claimed in claim 21, wherein the target is made of copper and the apparatus is for depositing a layer of copper on the first portion of the substrate.

24. An apparatus as claimed in claim 21, further comprising a vacuum chamber, the plasma generator being disposed in said chamber and, in use, generating an arc at the target thereby generating a plasma beam including positively charged ions, a substrate distal from the target and means for steering positive ions from the target through the duct and onto the substrate.

25. An apparatus as claimed in claim 21, wherein the beam steering arrangement includes a magnetic coil arrangement surrounding at least a portion of the plasma duct.

26. An apparatus as claimed in claim 21, wherein the duct is lined with a non magnetic, removable buffer liner.

27. An apparatus as claimed in claim 26, wherein the beam steering arrangement includes a liner biasing arrangement, whereby an electrical bias is applied to the liner, said liner bias being modulated to within 10V–50V.

28. An apparatus as claimed in claim 21, wherein the two bends in the duct comprise a first bend in a first plane and a second bend in a second plane, and wherein the first and second planes are not co-incident.

29. An apparatus as claimed in claim 28, wherein there is an angle of at least 20 degrees between the first and second planes.

30. An apparatus as claimed in claim 21, comprising a filter path that includes a double bend toroidal duct adapted substantially to remove macroparticles from the plasma beam.

31. An apparatus for controlling metal deposition, the apparatus comprising a plurality of electromagnetic coils a coil control device, and a beam biasing arrangement, the electromagnetic coils, in use, guiding a plasma beam including positively charged metal ions onto a substrate, the coil control device controlling the current applied to the coils to collimate the plasma beam and thereby to ensure that the plasma beam impacts the substrate in a direction substantially orthogonal to the substrate plane, and the beam biasing arrangement for applying a pulsed, amplitude modulated electrical bias to the plasma beam; wherein said electrical bias is generated by a signal generator that provides configurable signal characteristics to said electrical bias, said signal characteristics including frequency, duty cycle, peak voltage and deposition time, and wherein the signal characteristics are configured in accordance with a deposition process.

32. A beam biasing arrangement for applying a pulsed amplitude modulated electrical bias to a altered plasma beam, the biasing arrangement comprising:

a generator module for generating a pulsed amplitude modulated bias signal; and a processing device for supplying commands to the generator module corresponding to predetermined amplitude modulations;

the generator module generating a DC bias signal, switching the DC signal in order to generate a pulsed DC signal and applying predetermined modulations to the pulsed DC signal to generate the pulsed amplitude modulated electrical bias, and the processing device controlling the operation of the generator module by selecting modulations to be applied to the pulsed DC signal and determinimg in which order said modulations are to be applied, the beam biasing arrangement thereby inducing a predetermined collective behaviour within the plasma beam, wherein the generator module includes a programmable logic device, a power supply and a switching circuit, both the power supply and the switching circuit being controlled by the programmable logic device and an output of the power supply being coupled to the substrate via the switching circuit, and wherein the processing device controls operation of the programmable logic device thereby governing modulations applied to the pulsed bias signal.

* * * * *